US012742829B2

(12) United States Patent
Ni et al.

(10) Patent No.: US 12,742,829 B2
(45) Date of Patent: Sep. 22, 2026

(54) DIRECT CURRENT RESISTANCE DETECTION METHOD FOR BATTERIES, SYSTEM, DEVICE, AND STORAGE MEDIUM

(71) Applicant: CONTEMPORARY AMPEREX TECHNOLOGY CO., LIMITED, Ningde City (CN)

(72) Inventors: Ming Ni, Ningde (CN); Haili Li, Ningde (CN); Mingwei Yan, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 137 days.

(21) Appl. No.: 18/764,949

(22) Filed: Jul. 5, 2024

(65) Prior Publication Data

US 2024/0361396 A1 Oct. 31, 2024

Related U.S. Application Data

(63) Continuation of application No. PCT/CN2022/112450, filed on Aug. 15, 2022.

(51) Int. Cl.
*G01R 31/389* (2019.01)
*G01R 31/374* (2019.01)
(Continued)

(52) U.S. Cl.
CPC ......... *G01R 31/389* (2019.01); *G01R 31/374* (2019.01); *G01R 31/3842* (2019.01); *H02J 7/80* (2026.01)

(58) Field of Classification Search
CPC ............. G01R 31/389; G01R 31/3842; G01R 31/374; H02J 7/80
(Continued)

(56) References Cited

U.S. PATENT DOCUMENTS 12,388,280 B2 * 8/2025 Sherstyuk ............... H02J 7/927
2002/0161537 A1 10/2002 Odaohhara
(Continued)

FOREIGN PATENT DOCUMENTS

CN 102393508 A 3/2012
CN 103840225 A 6/2014
(Continued)

OTHER PUBLICATIONS

Extended European Search Report for EP application No. 22955214.6, dated May 9, 2025.
(Continued)

*Primary Examiner* — Huy Q Phan
*Assistant Examiner* — Trung Q Nguyen
(74) *Attorney, Agent, or Firm* — Ladas & Parry, LLP

(57) ABSTRACT

Provided are a direct current resistance (DCR) detection method for batteries, a system, a device, and a storage medium. Multiple discharging current pulses are applied during the constant current charging process of a battery to form a negative pulse charging mode. The discharging current can be added during the charging process to quickly remove the polarization effect of a battery cell generated during the charging process, thereby improving the charging acceptance capacity of the battery cell, shortening the charging time and increasing the charging efficiency. At the same time, a first battery voltage is obtained during the discharging current pulse time period, and a second battery voltage is obtained during the constant current charging time period after the discharging current pulse, thereby obtaining a DCR value of the battery during actual charging and use. The DCR of the battery cell can be detected simultaneously in the negative pulse charging mode.

13 Claims, 4 Drawing Sheets

(51) Int. Cl.
*G01R 31/3842* (2019.01)
*H02J 7/80* (2026.01)

(58) Field of Classification Search
USPC ...................... 324/500, 600, 76.11, 413–435
See application file for complete search history.

(56) References Cited

U.S. PATENT DOCUMENTS

| | | | | |
|---|---|---|---|---|
| 2006/0186890 | A1 | 8/2006 | Iwane et al. | |
| 2008/0024137 | A1 | 1/2008 | Carlin et al. | |
| 2011/0006738 | A1 | 1/2011 | Mikhaylik et al. | |
| 2012/0029851 | A1 | 2/2012 | Nakayama et al. | |
| 2013/0043843 | A1* | 2/2013 | Amiruddin | H01M 4/0447 429/231.95 |
| 2015/0028818 | A1* | 1/2015 | Merienne | G01R 27/205 324/509 |
| 2021/0091587 | A1* | 3/2021 | Nakao | B60L 53/80 |
| 2022/0329080 | A1* | 10/2022 | Kobayashi | H02J 7/54 |
| 2023/0018424 | A1* | 1/2023 | Na | H01M 10/446 |
| 2023/0393215 | A1* | 12/2023 | Bao | G01R 31/367 |
| 2024/0053106 | A1* | 2/2024 | Girondi | F28D 9/005 |

FOREIGN PATENT DOCUMENTS

| | | | |
|---|---|---|---|
| CN | 104122447 | A | 10/2014 |
| CN | 106125000 | A | 11/2016 |
| CN | 107045109 | A | 8/2017 |
| CN | 110824253 | A | 2/2020 |
| CN | 111413630 | A | 7/2020 |
| CN | 111525202 | A | 8/2020 |
| CN | 112230153 | A | 1/2021 |
| CN | 112485686 | A | 3/2021 |
| CN | 113138348 | A | 7/2021 |
| CN | 113777501 | A | 12/2021 |
| CN | 113866656 | A | 12/2021 |
| CN | 113894067 | A | 1/2022 |
| CN | 114200335 | A | 3/2022 |
| CN | 114731051 | A | 7/2022 |
| CN | 114879039 | A | 8/2022 |
| JP | 2013228216 | A | 11/2013 |
| WO | 2022078379 | A1 | 4/2022 |

OTHER PUBLICATIONS

Ye Fei et al. "Experimental Investigation on Internal Resistance for Vehicle Power Battery", Agricultural Equipment & Vehicle Engineering, vol. 57, No. 9, Sep. 2019.
First Office Action from corresponding Chinese Patent Application No. 202280007869.1 dated Apr. 17, 2026.
Wang Fang, Sun Zhipeng, Lin Chunjing et al., Experimental Analysis of Internal Resistance of Energy-Type LiFePO4 Power Batteries and Its Influencing Factors, Journal of Chongqing University of Technology (Natural Science), 2017( 8): 44-50.
Notice of Grant from corresponding Chinese Patent Application No. 202280007869.1 dated May 31, 2026.

* cited by examiner

DIRECT CURRENT RESISTANCE DETECTION METHOD FOR BATTERIES, SYSTEM, DEVICE, AND STORAGE MEDIUM

CROSS REFERENCE TO RELATED APPLICATION

This application is a continuation of International Patent Application No. PCT/CN2022/112450, filed on Aug. 15, 2022, which is incorporated by reference in its entirety.

TECHNICAL FIELD

The present application relates to the technical field of batteries, in particular to a direct current resistance (DCR) detection method for batteries, a system, a device, and a storage medium.

BACKGROUND

Direct current resistance is one of the important electrical properties of lithium-ion batteries. The direct current resistance of lithium-ion batteries is abbreviated as DCR, which is an important indicator for evaluating the performance of lithium-ion batteries, and directly affects the energy density and cycle life of lithium-ion batteries. Batteries with larger DCR also generate more heat, which affects the safety performance of lithium-ion batteries during use. Therefore, it is necessary to test the DCR of lithium-ion batteries.

Currently, the DCR of lithium-ion batteries is generally tested separately before the lithium-ion batteries leave the factory. In a traditional method, the battery cycle is stopped, and batteries are taken down and placed under specific conditions for separate DCR testing, so the changes in DCR during the battery cycle process cannot be continuously monitored. This makes it extremely difficult to study the change trend of DCR during the cycle process of lithium-ion batteries.

SUMMARY

Embodiments of the present application provide a DCR detection method for power batteries, a system, a device, and a storage medium, which can continuously monitor the DCR of lithium-ion batteries during battery use.

According to a first aspect, the present application provides a DCR detection method for batteries. The method includes the following steps: applying multiple discharging current pulses during the constant current charging process of a battery in response to a DCR detection instruction; obtaining a first battery voltage during the discharging current pulse time period, and obtaining a second battery voltage during the constant current charging time period after the discharging current pulse within the current DCR detection period; and obtaining a DCR value within the current DCR detection period according to the first battery voltage, the second battery voltage, and a battery capacity.

In this embodiment, multiple discharging current pulses are applied during the constant current charging process of a battery to form a negative pulse charging mode. The discharging current can be added during the charging process to quickly remove the polarization effect of a battery cell during the charging process, thereby improving the charging acceptance capacity of the battery cell, shortening the charging time and increasing the charging efficiency. At the same time, a first battery voltage is obtained during the discharging current pulse time period, and a second battery voltage is obtained during the constant current charging time period after the discharging current pulse, thereby obtaining a DCR value of the battery during actual charging and use. The DCR of the battery cell can be detected simultaneously in the negative pulse charging mode to identify the current aging state of the battery cell. Compared with the DCR detection value before leaving the factory, the accuracy is greatly increased.

In some embodiments, the DCR detection method further includes: obtaining a battery temperature value and the battery capacity within the current DCR detection period; and storing the mapping relationship between the DCR value, the battery temperature value, and the battery capacity.

In this embodiment, the battery temperature value and the battery capacity within the current DCR detection period are obtained and form one-to-one correspondence mapping with the DCR value within the same period to form a set of data for storage, which facilitates the subsequent retrieval of detection data within the same period to form and analyze a DCR data sequence in the entire charging process, thereby identifying the current aging state of a battery cell.

In some embodiments, the obtaining a DCR value within the current DCR detection period according to the first battery voltage, the second battery voltage, and a battery capacity specifically includes: obtaining a voltage difference according to the first battery voltage and the second battery voltage; and obtaining a DCR value within the current DCR detection period according to the ratio of the voltage difference to the battery capacity.

In this embodiment, a voltage difference is obtained through the first battery voltage and the second battery voltage; and a DCR value within the current DCR detection period is obtained according to the ratio of the voltage difference to the battery capacity, thereby realizing the detection of the DCR of the battery cell simultaneously in the pulse charging mode.

In some embodiments, the DCR detection method further includes: obtaining DCR values, battery temperature values, and battery capacities within multiple DCR detection periods; and obtaining DCR values corresponding to all calibrated temperatures and calibrated battery capacities of the battery through linear interpolation according to the DCR values, temperature values, and battery capacities within the multiple DCR detection periods.

In this embodiment, by acquiring multiple sets of DCR data within multiple DCR detection periods during the charging process, as well as the corresponding battery temperature values and battery capacities, DCR values corresponding to all calibrated temperatures and calibrated battery capacities of the battery are obtained through linear interpolation. That is, the DCR data during the entire charging process can be acquired, thereby increasing the detection accuracy of the DCR of the battery cell in the pulse charging mode.

In some embodiments, the DCR detection method further includes: determining whether to respond to a DCR detection instruction according to electrical parameters of the battery.

In this embodiment, whether to respond to the DCR detection instruction is determined according to electrical parameters of the battery, thereby ensuring that the detection of the DCR is performed under certain credible detection conditions, and increasing the detection accuracy of the DCR.

In some embodiments, the determining whether to respond to a DCR detection instruction according to electrical parameters of the battery specifically includes: determining to respond to the DCR detection instruction if one or more of the temperature detection value, current value, and voltage detection value of the battery are within the corresponding preset range for a period of time.

In this embodiment, whether to respond to the DCR detection instruction is determined according to electrical parameters of the battery, thereby ensuring that the detection of the DCR is performed under certain credible detection conditions. Specifically, if one or more of the temperature detection value, current value, and voltage detection value of the battery are limited within the corresponding preset range, it is determined to respond to the DCR detection instruction, thereby further increasing the detection accuracy of the DCR.

In some embodiments, the determining whether to respond to a DCR detection instruction according to electrical parameters of the battery specifically includes: determining to respond to the DCR detection instruction if a sampling error of the state of charge (SOC) value of the battery is corrected within a period of time.

In this embodiment, whether to respond to the DCR detection instruction is determined according to electrical parameters of the battery, thereby ensuring that the detection of the DCR is performed under certain credible detection conditions. Specifically, if a sampling error of the SOC value of the battery is corrected within a period of time, it is determined to respond to the DCR detection instruction, thereby further increasing the detection accuracy of the DCR.

In some embodiments, the DCR detection method further includes: correcting the initial allowable power of the battery according to the DCR value of the battery to obtain the corrected allowable power of the battery.

In this embodiment, the current aging state of the battery cell is identified through the detection value of the DCR of the battery, and simultaneously, the initial allowable power of the battery is corrected through the DCR value to obtain the corrected allowable power of the battery. Compared with the allowable power detection value before leaving the factory, the accuracy of the allowable power is increased.

In some embodiments, the correcting the initial allowable power of the battery according to the DCR value of the battery to obtain the corrected allowable power of the battery specifically includes: obtaining a power correction coefficient according to the DCR value and the lookup DCR value obtained by table lookup; and correcting the initial allowable power of the battery through the power correction coefficient to obtain the corrected allowable power of the battery.

In this embodiment, the initial allowable power of the battery is corrected through the DCR value to obtain the corrected allowable power of the battery. Specifically, the DCR value is compared with the lookup DCR value obtained by table lookup to obtain a power correction coefficient; and the initial allowable power of the battery is corrected through the power correction coefficient to obtain the corrected allowable power of the battery. Compared with the allowable power detection value before leaving the factory, the accuracy of the allowable power is further increased.

According to a second aspect, the present application provides a DCR detection apparatus for batteries, including: a detection instruction response module, configured to apply multiple discharging current pulses during the constant current charging process of a battery in response to a DCR detection instruction; and a DCR detection module, configured to obtain a first battery voltage during the discharging current pulse time period, and obtain a second battery voltage during the constant current charging time period after the discharging current pulse within the current DCR detection period; and obtain a DCR value within the current DCR detection period according to the first battery voltage, the second battery voltage, and a battery capacity.

In this embodiment, multiple discharging current pulses are applied during the constant current charging process of the battery through a detection instruction response module to form a negative pulse charging mode. The discharging current can be added during the charging process to quickly remove the polarization effect of a battery cell during the charging process, thereby improving the charging acceptance capacity of the battery cell, shortening the charging time and increasing the charging efficiency. At the same time, a first battery voltage is obtained during the discharging current pulse time period, and a second battery voltage is obtained during the constant current charging time period after the discharging current pulse through a DCR detection module, thereby obtaining a DCR value of the battery during actual charging and use. The DCR of the battery cell can be detected simultaneously in the negative pulse charging mode to identify the current aging state of the battery cell. Compared with the DCR detection value before leaving the factory, the accuracy is greatly increased.

According to a third aspect, the present application provides a computing device, including a memory, a processor, and a computer program stored in the memory and executable on the processor. When the processor executes the computer program, any of the above DCR detection methods can be implemented.

In this embodiment, multiple discharging current pulses are applied during the constant current charging process of a battery to form a negative pulse charging mode. The discharging current can be added during the charging process to quickly remove the polarization effect of a battery cell during the charging process, thereby improving the charging acceptance capacity of the battery cell, shortening the charging time and increasing the charging efficiency. At the same time, a first battery voltage is obtained during the discharging current pulse time period, and a second battery voltage is obtained during the constant current charging time period after the discharging current pulse, thereby obtaining a DCR value of the battery during actual charging and use. The DCR of the battery cell can be detected simultaneously in the negative pulse charging mode to identify the current aging state of the battery cell. Compared with the DCR detection value before leaving the factory, the accuracy is greatly increased.

According to a fourth aspect, the present application provides a computer-readable storage medium storing a computer program. The computer program can be executed by a processor to implement any of the above DCR detection methods.

In this embodiment, multiple discharging current pulses are applied during the constant current charging process of a battery to form a negative pulse charging mode. The discharging current can be added during the charging process to quickly remove the polarization effect of a battery cell during the charging process, thereby improving the charging acceptance capacity of the battery cell, shortening the charging time and increasing the charging efficiency. At the same time, a first battery voltage is obtained during the discharging current pulse time period, and a second battery voltage is obtained during the constant current charging time period after the discharging current pulse, thereby obtaining a DCR value of the battery during actual charging and use. The DCR of the battery cell can be detected simultaneously in the negative pulse charging mode to identify the current aging state of the battery cell. Compared with the DCR detection value before leaving the factory, the accuracy is greatly increased.

BRIEF DESCRIPTION OF DRAWINGS

In order to illustrate the technical solutions in the embodiments of the present application more clearly, the following briefly introduces the drawings required in the embodiments of the present application. Obviously, the drawings described below are only some embodiments of the present application. For those of ordinary skill in the art, other drawings can also be obtained according to these drawings without any creative effort.

DETAILED DESCRIPTION

Figure 1:
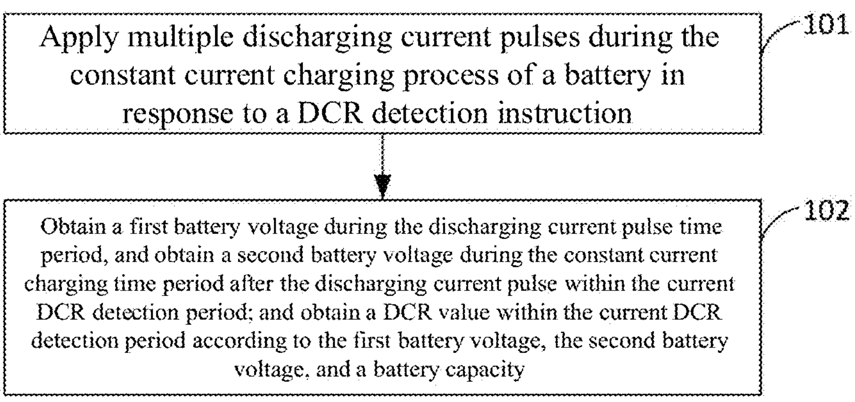
FIG. 1 is a flowchart of a DCR detection method provided in an embodiment of the present application.

The embodiments of the present application are further described in detail below with reference to the drawings and embodiments. The following detailed description of the embodiments and the drawings are used to illustrate the principles of the present application by way of example, but should not be used to limit the scope of the present application, that is, the present application is not limited to the described embodiments.

In the description of the present application, it should be noted that, unless otherwise stated, "multiple" means two or more; and the orientation or position relationships indicated by the terms "upper", "lower", "left", "right", "inner" and "outer" are only for facilitating the description of the present application and simplifying the description, rather than indicating or implying that the apparatus or element referred to must have a particular orientation or be constructed and operated in a particular orientation, and therefore will not be interpreted as limiting the present application. In addition, the terms "first", "second", "third", and the like are used for descriptive purposes only, and cannot be construed as indicating or implying the relative importance. "Vertical" is not strictly vertical, but within an allowable range of an error. "Parallel" is not strictly parallel, but within an allowable range of an error.

The orientation words appearing in the following description are the directions shown in the figures, and do not limit the specific structure of the present application. In the description of the present application, it should also be noted that unless otherwise clearly specified and defined, the terms "mounting", "connected to" and "connecting" should be understood in a broad sense. For example, the connection may be fixed connection, detachable connection, or integrated connection; and the connection may be direct connection, or indirect connection through an intermediate. For those of ordinary skill in the art, the specific meanings of the above terms in the present application may be understood according to specific circumstances.

At present, from the perspective of the development of the market situation, batteries are more and more widely used. Batteries are used in energy storage power source systems such as hydraulic, thermal, wind and solar power stations, as well as in multiple fields such as electric vehicles including electric bicycles, electric motorcycles, electric cars and the like, military equipment, aerospace, and the like. In the fields such as electric transportation supply, military equipment and aerospace, power is usually provided through batteries.

Direct current resistance is one of the important electrical properties of lithium-ion batteries. The direct current resistance of lithium-ion batteries is abbreviated as DCR which is an important indicator for evaluating the performance of lithium-ion batteries and directly affects the energy density and cycle life of lithium-ion batteries.

Moreover, the number of electric vehicles is constantly increasing, which makes significant contributions to energy conservation, environment protection and sustainable development proposed in China. To further vigorously promote the electrification process, range anxiety and charging time are two pain points that must be solved. The charging time is particularly important, and excessive charging time further exacerbates the anxiety of users about the range. However, blindly pursuing the charging speed may double the charging safety risk, such as lithium plating and gas production, which ultimately affects the battery life. This is also something we do not want to see. Therefore, how to well balance the charging safety and the charging time has always been a major challenge to be solved by engineers. A suitable charging mode can not only shorten the charging time and increase the charging efficiency, but also prolong the service life of the battery. The currently proposed negative pulse charging mode can balance the problems of short charging time and charging safety. The implementation mode is as follows: the discharging current is added during the charging process to quickly remove the polarization effect of a battery cell of a battery during the charging process, thereby improving the charging acceptance capacity of the battery cell, shortening the charging time and increasing the charging efficiency.

Based on the above, the inventors of the present application discovered that the DCR of the battery cell is detected in the negative pulse stage to identify the current aging state of the battery cell of the battery, and the aging power and allowable power of the battery can be further updated and calculated.

In order to provide a DCR detection method for continuously monitoring the DCR of lithium-ion batteries during battery use, through the in-depth research, the inventors of the present application design a DCR detection method. In the method, multiple discharging current pulses are applied during the constant current charging process of a battery to form a negative pulse charging mode. The discharging current can be added during the charging process to quickly remove the polarization effect of a battery cell during the charging process, thereby improving the charging acceptance capacity of the battery cell, shortening the charging time and increasing the charging efficiency. At the same time, a first battery voltage is obtained during the discharging current pulse time period, and a second battery voltage is obtained during the constant current charging time period after the discharging current pulse, thereby obtaining a DCR value of the battery during actual charging and use. The DCR of the battery cell can be detected simultaneously in the negative pulse charging mode to identify the current aging state of the battery cell. Compared with the DCR detection value before leaving the factory, the accuracy is greatly increased.

The DCR detection method provided in the embodiment of the present application can be applied to any battery. The battery may be a single battery cell, or a battery group or battery pack composed of multiple single battery cells. An electrical device that can apply the method provided in the embodiment of the present application may be, but is not limited to, an electric toy, an electric tool, a battery vehicle, an electric vehicle, a ship, a spacecraft, or the like with batteries. The electric toy may include fixed or mobile electric toys, such as game consoles, electric vehicle toys, electric ship toys, electric airplane toys, and the like. The spacecraft may include airplanes, rockets, space shuttles, spaceships, and the like. The above electrical device may be in communication connection with a server.

The server may be a single physical server device, a server cluster composed of multiple devices, or a cloud server of public cloud or private cloud. The electrical device can receive a DCR detection instruction sent by the server, and detect the DCR of the battery through the method in the embodiment of the present application. The above electrical device may also be in communication connection with a user terminal, such as a mobile phone, a laptop, a notebook computer, or the like of a user. The electrical device can receive a DCR detection instruction sent by the user through the user terminal, and detect the DCR of the battery through the method in the embodiment of the present application. Alternatively, a control module in the electrical device can also provide the user with an interface for triggering the DCR detection instruction, and the user can submit the DCR detection instruction to the electrical device through the interface. For example, a center console of an electric vehicle can display a button for initiating DCR detection, and the user can click the button to submit the DCR detection instruction to the electric vehicle. The electrical device may also be connected to a charging and discharging device in a charging station, a battery swapping station, or the like to receive the DCR detection instruction triggered by the charging and discharging device. The charging and discharging device may be a charging pile, a charging and discharging machine, or the like. The above electrical device may also be connected to a maintenance device to receive the DCR detection instruction triggered by the maintenance device.

The above lists multiple application scenarios where the electrical device is connected to other devices and receives the DCR detection instruction triggered by the other devices, but the present application is not limited to the application scenarios listed above. For any other application scenarios that can trigger DCR detection, the DCR of the battery can be detected according to the method provided in the embodiment of the present application, including: DCR detection actively triggered by the control module of the electrical device based on the state of the electrical device and/or the battery.

The specific process of detecting the DCR of the battery in the present application is described in detail below through specific embodiments. An embodiment of the present application provides a DCR detection method. In this method, after a DCR detection instruction is received, a target detection working condition corresponding to the detection instruction is first determined. The battery is then controlled to run under the target detection working condition, and the DCR of the battery is detected under the target detection working condition. For example, different application scenarios and battery aging paths will adopt different detection methods to avoid the situation that the error of the detection accuracy will increase with battery aging by using the same detection method under different aging paths. For different detection instructions, the DCR of the battery is detected under different target detection working conditions, which can meet the detection needs for the DCR under various working conditions. This method is not only applicable to energy storage systems, but also applicable to detection requests on the vehicle side, server side or user side. The detection method has small limitations and high universality.

The specific process of detecting the DCR of the battery in the present application is described in detail below through specific embodiments. An embodiment of the present application provides a DCR detection method for batteries. In this method, after a DCR detection instruction is received, a target detection working condition corresponding to the detection instruction is first determined. The battery is then controlled to run under the target detection working condition, and the DCR of the battery is detected under the target detection working condition. For example, different application scenarios and battery aging paths will adopt different detection methods to avoid the situation that the error of the detection accuracy will increase with battery aging by using the same detection method under different aging paths. For different detection instructions, the DCR of the battery is detected under different target detection working conditions, which can meet the detection needs for the DCR under various working conditions. This method is not only applicable to energy storage systems, but also applicable to detection requests on the vehicle side, server side or user side. The detection method has small limitations and high universality.

FIG. 1 is a flowchart of a DCR detection method provided in an embodiment of the present application.

As shown in FIG. 1, the method specifically includes the following steps:

Step 101: Multiple discharging current pulses are applied during the constant current charging process of a battery in response to a DCR detection instruction.

An executive body in the embodiment of the present application is an electrical device, a control module in the electrical device, or the like. The control module may be a battery management system (BMS), a vehicle control unit (VCU), a domain controller (DC), or the like. The embodiment of the present application takes the control module as the executive body for detailed description.

In the embodiment of the present application, in the negative pulse charging mode, that is, multiple discharging current pulses are applied during the constant current charging process of a battery to form the negative pulse charging mode, and the discharging current can be added during the charging process. In this charging mode, the inventors discovered that the polarization effect of a battery cell during the charging process can be quickly removed, thereby improving the charging acceptance capacity of the battery cell, shortening the charging time and increasing the charging efficiency. Simultaneously, the DCR of the battery cell can also be detected in the negative pulse stage.

Step 102: A first battery voltage is obtained during the discharging current pulse time period, and a second battery voltage is obtained during the constant current charging time period after the discharging current pulse within the current DCR detection period; and a DCR value within the current DCR detection period is obtained according to the first battery voltage, the second battery voltage, and a battery capacity.

Through step 101, the charging mode is the negative pulse charging mode, and multiple DCR detection periods are formed. A DCR detection period includes a constant current charging time period for inputting charging current within a certain period of time, and a discharging current pulse time period for inputting discharging current pulses within a certain period of time.

In the embodiment of the present application, a first battery voltage is obtained during the discharging current pulse time period, and a second battery voltage is obtained during the constant current charging time period after the discharging current pulse; and a DCR value within the current DCR detection period is obtained according to the first battery voltage, the second battery voltage, and a battery capacity.

In this embodiment, multiple discharging current pulses are applied during the constant current charging process of a battery to form a negative pulse charging mode. The discharging current can be added during the charging process to quickly remove the polarization effect of a battery cell during the charging process, thereby improving the charging acceptance capacity of the battery cell, shortening the charging time and increasing the charging efficiency. At the same time, a first battery voltage is obtained during the discharging current pulse time period, and a second battery voltage is obtained during the constant current charging time period after the discharging current pulse, thereby obtaining a DCR value of the battery during actual charging and use. The DCR of the battery cell can be detected simultaneously in the negative pulse charging mode to identify the current aging state of the battery cell. Compared with the DCR detection value before leaving the factory, the accuracy is greatly increased.

In some embodiments, the DCR detection method further includes: a battery temperature value and the battery capacity within the current DCR detection period are obtained; and the mapping relationship between the DCR value, the battery temperature value, and the battery capacity is stored.

The battery temperature value and the battery capacity within the current DCR detection period are obtained and form one-to-one correspondence mapping with the DCR value within the same period to form a set of data for storage, which facilitates the subsequent retrieval of detection data within the same period to form and analyze a DCR data sequence in the entire charging process, thereby identifying the current aging state of a battery cell.

During a specific implementation, a DCR value within the current DCR detection period is obtained according to a first battery voltage V1 obtained during the discharging current pulse time period, a second battery voltage V2 obtained during the constant current charging time period, and a battery capacity. Specifically, a voltage difference is obtained according to the first battery voltage and the second battery voltage V2; and then, a DCR value within the current DCR detection period is obtained according to the ratio of the voltage difference (V2−V1) to the battery capacity Cap (Cap is the current actual capacity of the battery cell), that is, the magnitude of the DCR is (V2−V1)/Cap.

In this embodiment, a voltage difference is obtained according to the first battery voltage and the second battery voltage; and a DCR value within the current DCR detection period is obtained according to the ratio of the voltage difference to the battery capacity, thereby realizing the detection of the DCR of the battery cell simultaneously in the pulse charging mode.

In a further implementation, multiple sets of data within multiple DCR detection periods are acquired through the above method. A set of data includes a DCR value within this period, as well as the corresponding battery temperature value and battery capacity.

Then, DCR values corresponding to all calibrated temperatures and calibrated battery capacities of the battery are obtained through linear interpolation according to the DCR values, temperature values, and battery capacities within the multiple DCR detection periods.

The present application considers that when there are enough stored DCR values, it is not necessary to calculate every SOC and temperature point during the charging process. The DCR value exhibits a linear relationship in different SOC segments at the same temperature, so uncalculated points can be interpolated and completed by fitting. In a similar way, when the DCR value is the same, there is also a linear relationship between different temperature ranges, so uncalculated points can be interpolated and completed by fitting. Finally, DCR values at all temperatures and SOC can be obtained.

In this embodiment, by acquiring multiple sets of DCR data within multiple DCR detection periods during the charging process, as well as the corresponding battery temperature values and battery capacities, DCR values corresponding to all calibrated temperatures and calibrated battery capacities of the battery are obtained through linear interpolation. That is, the DCR data during the entire charging process can be acquired, thereby increasing the detection accuracy of the DCR of the battery cell in the pulse charging mode.

Figure 2:
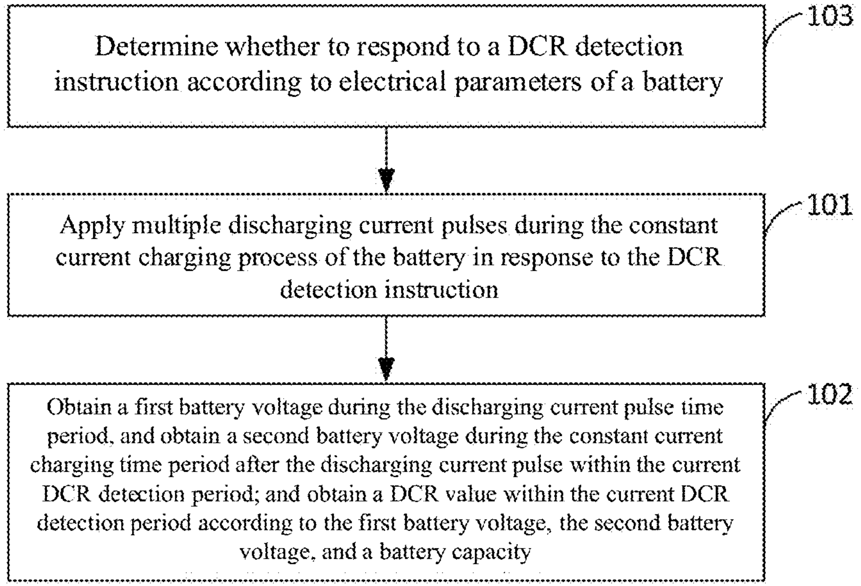
FIG. 2 is a flowchart of a DCR detection method provided in another embodiment of the present application.

FIG. 2 is a flowchart of a DCR detection method provided in another embodiment of the present application.

As shown in FIG. 2, the DCR detection method further includes:

Step 103: Whether to respond to a DCR detection instruction is determined according to electrical parameters of the battery.

Whether to respond to the DCR detection instruction is determined according to electrical parameters of the battery, thereby ensuring that the detection of the DCR is performed under certain credible detection conditions, and increasing the detection accuracy of the DCR.

In an embodiment, the step of determining whether to respond to a DCR detection instruction according to electrical parameters of the battery specifically includes: it is determined to respond to the DCR detection instruction if one or more of the temperature detection value, current value, and voltage detection value of the battery are within the corresponding preset range for a period of time. That is, if sampling signals such as the internal temperature, current, voltage, and the like of the BMS are detected to be valid, it is allowed to calculate and update the DCR value, otherwise, the DCR value is not calculated.

In this embodiment, whether to respond to the DCR detection instruction is determined according to electrical parameters of the battery, thereby ensuring that the detection of the DCR is performed under certain credible detection conditions. Specifically, if one or more of the temperature detection value, current value, and voltage detection value of the battery are limited within the corresponding preset range, it is determined to respond to the DCR detection instruction, thereby further increasing the detection accuracy of the DCR.

In some other embodiments, the step of determining whether to respond to a DCR detection instruction according to electrical parameters of the battery specifically includes: it is determined to respond to the DCR detection instruction if a sampling error of the SOC value of the battery is corrected within a period of time.

The SOC represents the state of charge of the battery and is calculated according to accumulated ampere hour integrals. Due to a sampling error of a current sensor, there will be an accumulated sampling error through ampere hour integrals, and then, the error will be corrected through an OCV curve. If the error is not corrected after a long time of charging and discharging cycles, it is considered that the SOC is unreliable.

In this embodiment, whether to respond to the DCR detection instruction is determined according to electrical parameters of the battery, thereby ensuring that the detection of the DCR is performed under certain credible detection conditions. Specifically, if a sampling error of the SOC value of the battery is corrected within a period of time, it is determined to respond to the DCR detection instruction, thereby further increasing the detection accuracy of the DCR.

Figure 3:
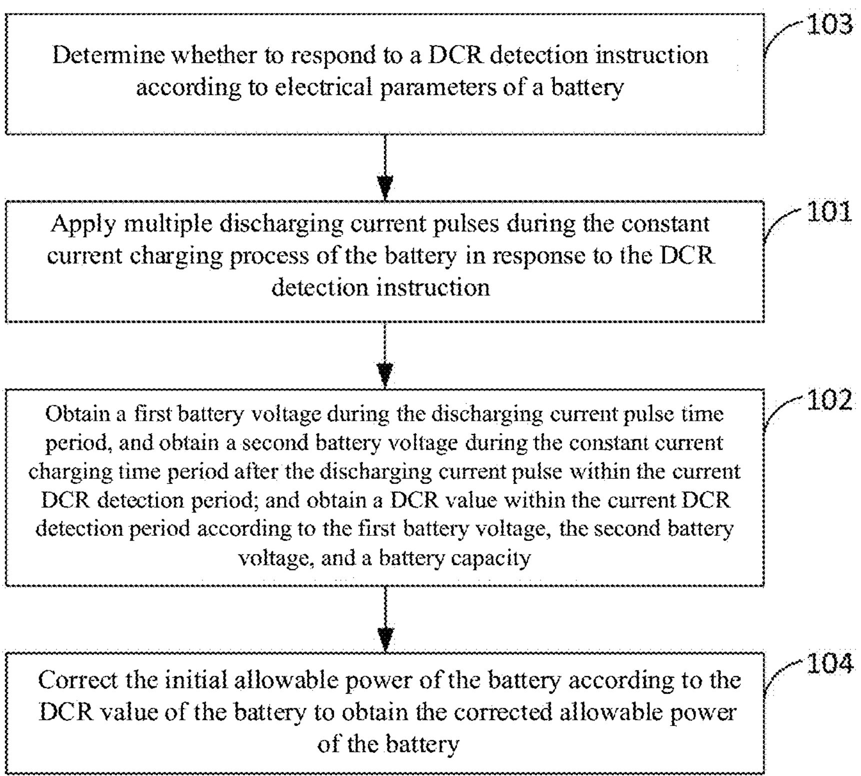
FIG. 3 is a flowchart for correcting the allowable power of a battery by a DCR detection method provided in the present application according to an embodiment of the present application.

FIG. 3 is a flowchart for correcting the allowable power of a battery by a DCR detection method provided in the present application according to an embodiment of the present application.

As shown in FIG. 3, the DCR detection method further includes: Step 104: The initial allowable power of the battery is corrected according to the DCR value of the battery to obtain the corrected allowable power of the battery.

The current aging state of the battery cell is identified through the detection value of the DCR of the battery, and simultaneously, the initial allowable power of the battery is corrected through the DCR value to obtain the corrected allowable power of the battery. Compared with the allowable power detection value before leaving the factory, the accuracy of the allowable power is increased.

The step 104 of correcting the initial allowable power of the battery according to the DCR value of the battery to obtain the corrected allowable power of the battery specifically includes: a DCR value DCR1 is compared with a lookup DCR value DCR2 obtained by table lookup to obtain the ratio of the DCR1 to the DCR2 in the present application, thereby obtaining a power correction coefficient k=(DCR1/DCR2). Then, the initial allowable power P of the battery is corrected through the power correction coefficient k to obtain the corrected allowable power of the battery, that is, P*k.

In this embodiment, the initial allowable power of the battery is corrected through the DCR value to obtain the corrected allowable power of the battery. Specifically, the DCR value is compared with the lookup DCR value obtained by table lookup to obtain a power correction coefficient; and the initial allowable power of the battery is corrected through the power correction coefficient to obtain the corrected allowable power of the battery. Compared with the allowable power detection value before leaving the factory, the accuracy of the allowable power is further increased.

In order to facilitate the understanding of the complete process of the method provided in the embodiment of the present application, the implementation process is specifically described below.

Figure 4:
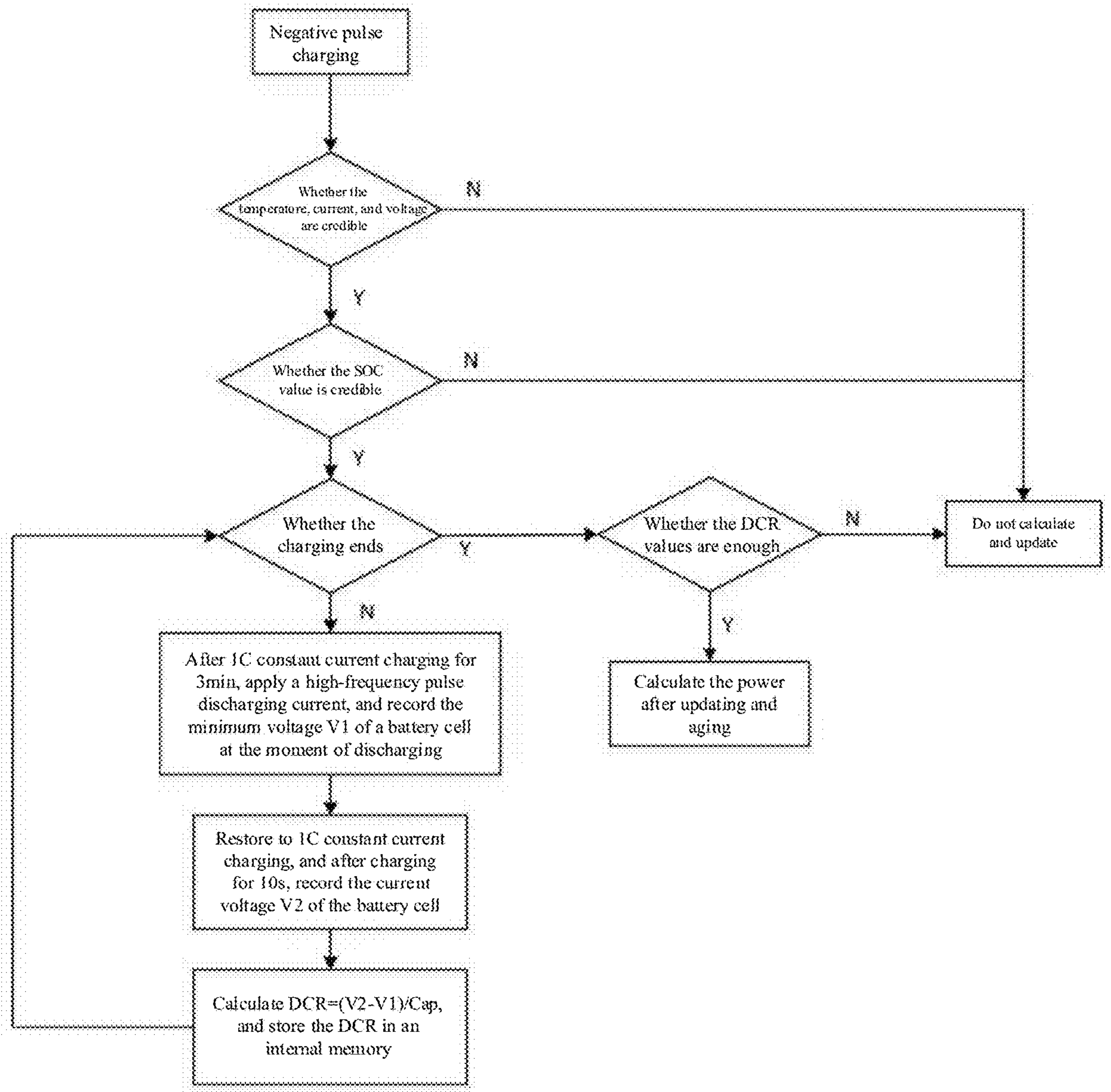
FIG. 4 is an overall schematic flowchart of a DCR detection method for batteries provided in an embodiment of the present application.

FIG. 4 is an overall schematic flowchart of a DCR detection method for batteries provided in an embodiment of the present application.

1) As shown in FIG. 4, first, whether to respond to a DCR detection instruction is determined according to electrical parameters of a battery. That is, during the charging process, if sampling signals such as the internal temperature, current, voltage, and the like of the BMS are detected to be valid, it is allowed to calculate and update the DCR value, otherwise, the DCR value is not calculated.

Alternatively, if the internal SOC value of the BMS is unreliable, that is, there is no chance of correction for a long time, the DCR is not calculated and updated, otherwise, the DCR is calculated. The SOC represents the state of charge of the battery and is calculated according to accumulated ampere hour integrals. Due to a sampling error of a current sensor, there will be an accumulated sampling error through ampere hour integrals, and then, the error will be corrected through an OCV curve. If the error is not corrected after a long time of charging and discharging cycles, it is considered that the SOC is unreliable.

2) After the DCR detection instruction response condition in step (1), the DCR calculation is performed every 5% SOC.

For example, during the charging process, 1C constant current charging is used. When the charging time reaches 3 minutes, a high-frequency pulse discharging current is applied, the minimum voltage V1 of the battery cell at the moment of discharging is recorded, and then, 1C constant current charging is restored. After charging for 10 seconds, the current voltage V2 of the battery cell is recorded. The magnitude of the DCR is (V2−V1)/Cap, where Cap is the current actual capacity of the battery cell. The calculated DCR value is stored in the address corresponding to the temperature and SOC. That is, a set of stored data includes DCR, a temperature point, and Cap.

3) Step (2) is repeated to obtain multiple sets of data within multiple measurement periods until the entire charging behavior is completed. When there are enough stored DCR values, the DCR exhibits a linear relationship in different SOC segments at the same temperature, so uncalculated points can be interpolated and completed by fitting. In a similar way, when the SOC is the same, there is a linear relationship between different temperature ranges, so uncalculated points can be interpolated and completed by fitting. Finally, DCR values at all temperatures and SOC can be obtained.

4) Finally, the DCR1 values measured in a laboratory at different temperatures and SOC before the battery cell leaves the factory are compared with the DCR2 value calculated through negative pulse charging in step 3) to obtain power correction coefficients k (DCR1/DCR2) at different temperatures and SOC. The allowable power for final aging is P*k, where P is the initial allowable power measured under a fresh battery cell.

For example, if the DCR value of the battery cell measured at 25° C. and 50% SOC in the laboratory is 1 milliohm, and the DCR value calculated at 25° C. and 50% SOC is 1.2 milliohm after the battery cell is aged for a period of time, the power correction coefficient is k=1/1.2=0.83.

Figure 5:
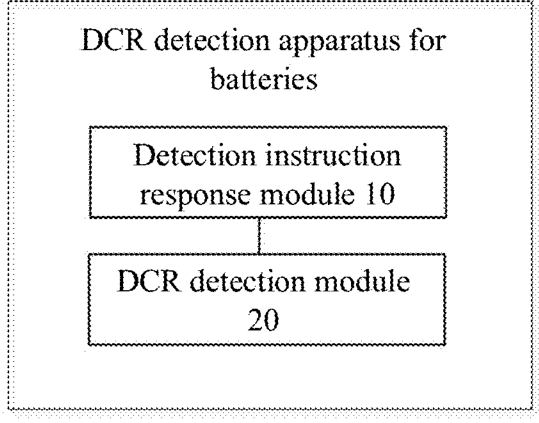
FIG. 5 is a schematic structural diagram of a DCR detection apparatus for batteries provided in an embodiment of the present application.

FIG. 5 is a schematic structural diagram of a DCR detection apparatus for batteries provided in an embodiment of the present application.

As shown in FIG. 5, an embodiment of the present application further provides a DCR detection apparatus for batteries. The apparatus is configured to perform the DCR detection method for batteries provided in each of the above embodiments.

The apparatus includes a detection instruction response module 10 and a DCR detection module 20.

Specifically, the detection instruction response module 10 is configured to apply multiple discharging current pulses during the constant current charging process of a battery in response to a DCR detection instruction.

The DCR detection module 20 is configured to obtain a first battery voltage during the discharging current pulse time period, and obtain a second battery voltage during the constant current charging time period after the discharging current pulse within the current DCR detection period; and obtain a DCR value within the current DCR detection period according to the first battery voltage, the second battery voltage, and a battery capacity.

The DCR detection module 20 is further configured to obtain a battery temperature value and the battery capacity within the current DCR detection period; and store the mapping relationship between the DCR value, the battery temperature value, and the battery capacity.

The DCR detection module 20 is further configured to obtain a voltage difference according to the first battery voltage and the second battery voltage; and obtain a DCR value within the current DCR detection period according to the ratio of the voltage difference to the battery capacity.

The DCR detection module 20 is further configured to obtain DCR values, battery temperature values, and battery capacities within multiple DCR detection periods; and obtain DCR values corresponding to all calibrated temperatures and calibrated battery capacities of the battery through linear interpolation according to the DCR values, temperature values, and battery capacities within the multiple DCR detection periods.

The apparatus further includes an instruction response module, configured to determine whether to respond to a DCR detection instruction according to electrical parameters of the battery.

The instruction response module is specifically configured to determine to respond to the DCR detection instruction if one or more of the temperature detection value, current value, and voltage detection value of the battery are within the corresponding preset range for a period of time; or determine to respond to the DCR detection instruction if a sampling error of the SOC value of the battery is corrected within a period of time.

The apparatus further includes an allowable power correction module, configured to correct the initial allowable power of the battery according to the DCR value of the battery to obtain the corrected allowable power of the battery.

The allowable power correction module is specifically configured to compare the DCR value with the lookup DCR value obtained by table lookup to obtain a power correction coefficient; and correct the initial allowable power of the battery through the power correction coefficient to obtain the corrected allowable power of the battery.

In this embodiment, multiple discharging current pulses are applied during the constant current charging process of the battery through the detection instruction response module 10 to form a negative pulse charging mode. The discharging current can be added during the charging process to quickly remove the polarization effect of a battery cell during the charging process, thereby improving the charging acceptance capacity of the battery cell, shortening the charging time and increasing the charging efficiency. At the same time, a first battery voltage is obtained during the discharging current pulse time period, and a second battery voltage is obtained during the constant current charging time period after the discharging current pulse through the DCR detection module 20, thereby obtaining a DCR value of the battery during actual charging and use. The DCR of the battery cell can be detected simultaneously in the negative pulse charging mode to identify the current aging state of the battery cell. Compared with the DCR detection value before leaving the factory, the accuracy is greatly increased.

The DCR detection apparatus for batteries provided in the above embodiment of the present application and the DCR detection method for batteries provided in the embodiment of the present application have the same inventive concept, and have the same beneficial effects as the method used, operated, or implemented by the stored application program.

Figure 6:
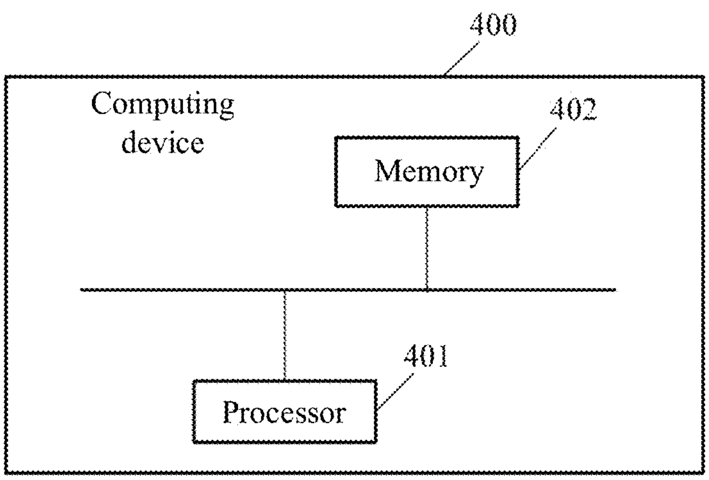
FIG. 6 is a schematic structural diagram of an electronic device provided in an embodiment of the present application.

FIG. 6 is a schematic block diagram of a computing device 400 provided in an embodiment of the present application.

As shown in FIG. 6, the computing device 400 includes: a memory 402 configured to store an executable instruction; and a processor 401 connected to the memory 402 to execute the executable instruction to complete the DCR detection method for batteries.

Those skilled in the art can understand that the schematic diagram 5 is only an example of the computing device 400, and does not constitute a limitation to the computing device 400. The computing device 400 may include more or less components than those shown in the figure, or combine some components, or have different components. For example, the computing device 400 may further include input and output devices, network access devices, buses, and the like.

The central processing unit (CPU) 401 may also be another general-purpose processor, digital signal processor (DSP), application specific integrated circuit (ASIC), field-programmable gate array (FPGA), programmable logic device, discrete gate or transistor logic device, discrete hardware component, or the like. The general-purpose processor may be a microprocessor, or the processor 401 may be any conventional processor, or the like. The processor 401 is a control center of the computing device 400, and various interfaces and lines are used to connect all parts of the entire computing device 400.

The memory 402 can be configured to store a computer-readable instruction. The processor 401 implements various functions of the computing device 400 by running or executing the computer-readable instruction or module stored in the memory 402, and invoking the data stored in the memory 402. The memory 402 may mainly include a program storage area and a data storage area, where the program storage area may store an operating system, an application program required by at least one function (such as a sound playback function, an image playback function, or the like), and the like; and the data storage area may store the data created according to the use of the computing device 400, and the like. In addition, the memory 402 may include a hard disk, an internal memory, a plug-in hard disk, a smart media card (SMC), a secure digital (SD) card, a flash card, at least one magnetic disk storage device, a flash memory device, a read-only memory (ROM), a random access memory (RAM), or another non-volatile/volatile storage device.

If the integrated module of the computing device 400 is implemented as a software function module and sold or used as an independent product, the integrated module can be stored in a computer-readable storage medium. Based on this understanding, the present invention implements all or part of the processes in the above embodiment methods, or the processes can also be completed by instructing related hardware through the computer-readable instruction. The computer-readable instruction can be stored in a computer-readable storage medium. The computer-readable instruction, when executed by a processor, can implement the steps in each of the above method embodiments.

Finally, the present application further provides a computer-readable storage medium storing a computer program. The computer program, when executed by a processor, implements the DCR detection method.

Those of ordinary skill in the art can realize that units and algorithm steps of each example described with reference to the embodiments disclosed herein can be implemented by electronic hardware, or a combination of computer software and electronic hardware. Whether these functions are performed in hardware or software depends on a specific application and a design constraint condition of the technical solution. Those skilled in the art may implement the described functions using different methods for each particular application, but such implementation should not be considered beyond the scope of the present application.

Those skilled in the art can clearly understand that for the convenience and brevity of description, the specific working processes of the system, apparatus, and unit described above may be obtained with reference to the corresponding processes in the above method embodiments, which will not be repeated here.

In several embodiments provided in the present application, it should be understood that the disclosed system, apparatus, and method may be implemented in other manners. For example, the apparatus embodiment described above is only illustrative. For example, the division of the units is only a logical function division. In an actual implementation, there may be other division methods. For example, a plurality of units or components may be combined or may be integrated into another system, or some features may be ignored, or not implemented. On the other hand, the shown or discussed mutual coupling or direct coupling or communication connection may be indirect coupling or communication connection through some interfaces, apparatuses, or units, and may be in electrical, mechanical, or in other forms.

The units described as separate components may or may not be physically separated, and components displayed as units may or may not be physical units, that is, may be located in one place, or may be distributed to a plurality of network units. Some or all of the units may be selected according to actual needs to achieve the purpose of the solution in this embodiment.

In addition, each functional unit in each embodiment of the present application may be integrated into one processing unit, each unit may separately exist physically, or two or more units may be integrated into one unit.

If the functions described above are implemented in the form of software function units and sold or used as independent products, the functions can be stored in a computer-readable storage medium. Based on this understanding, the technical solution of the present application is essentially or the part that contributes to the prior art or the part of the technical solution can be embodied in the form of a software product. The computer software product is stored in a storage medium, and includes several instructions for causing a computer device (which may be a personal computer, a server, a network device, or the like) to perform all or part of the steps in the method described in each embodiment of the present application. The above storage medium includes various media capable of storing program codes, such as a USB flash disk, a mobile hard disk, a ROM, a RAM, a magnetic disk, and an optical disk.

The above descriptions are merely specific embodiments of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be determined with reference to the protection scope of the claims.

What is claimed is:

1. A direct current resistance (DCR) detection method for batteries, comprising:

providing a battery and connecting the battery to charge the battery under constant current during a charging period;

in response to a DCR detection instruction, controlling a pulse circuit to successively apply multiple discharging current pulses to the battery in addition to the constant charging current during the charging period of the battery;

during a discharging current pulse, controlling a DCR detection module to obtain a first battery voltage during a discharging current pulse time period;

after the discharging current pulse and during the constant current charging time period, controlling the DCR detection module to obtain a second battery voltage within a current DCR detection period; and controlling the DCR detection module to obtain a DCR value within the current DCR detection period according to the first battery voltage, the second battery voltage, and a battery capacity.

2. The DCR detection method according to claim 1, further comprising:

obtaining a battery temperature value and the battery capacity within the current DCR detection period; and storing a mapping relationship between the DCR value, the battery temperature value, and the battery capacity.

3. A direct current resistance (DCR) detection method for batteries, comprising:

providing a battery and connecting the battery to charge the battery under constant current during a charging period;

in response to a DCR detection instruction, controlling a pulse circuit to successively apply multiple discharging current pulses to the battery in addition to the constant charging current during the charging period of the battery;

during a discharging current pulse, controlling a DCR detection module to obtain a first battery voltage during a discharging current pulse time period;

after the discharging current pulse and during the constant current charging time period, controlling the DCR detection module to obtain a second battery voltage within a current DCR detection period; and controlling the DCR detection module to obtain a DCR value within the current DCR detection period according to the first battery voltage, the second battery voltage, and a battery capacity, wherein controlling the DCR detection module to obtain the DCR value within the current DCR detection period according to the first battery voltage, the second battery voltage, and a battery capacity comprises:

obtaining a voltage difference according to the first battery voltage and the second battery voltage; and obtaining a DCR value within the current DCR detection period according to a ratio of the voltage difference to the battery capacity.

4. The DCR detection method according to claim 1, further comprising:

obtaining DCR values, temperature values, and battery capacities within multiple DCR detection periods; and obtaining DCR values corresponding to all calibrated temperatures and calibrated battery capacities of the battery through linear interpolation according to the DCR values, temperature values, and battery capacities within the multiple DCR detection periods.

5. The DCR detection method according to claim 1, further comprising:

determining whether to respond to the DCR detection instruction according to electrical parameters of the battery.

6. The DCR detection method according to claim 5, wherein determining whether to respond to the DCR detection instruction according to electrical parameters of the battery comprises:

determining to respond to the DCR detection instruction if one or more of a temperature detection value, a current value, and a voltage detection value of the battery are within a corresponding preset range for a period of time.

7. The DCR detection method according to claim 5, wherein determining whether to respond to the DCR detection instruction according to electrical parameters of the battery comprises:

determining to respond to the DCR detection instruction if a sampling error of a state of charge (SOC) value of the battery is corrected within a period of time.

8. The DCR detection method according to claim 1, further comprising:

correcting an initial allowable power of the battery according to the DCR value of the battery to obtain the corrected allowable power of the battery.

9. The DCR detection method according to claim 8, wherein correcting the initial allowable power of the battery according to the DCR value of the battery to obtain the corrected allowable power of the battery comprises:

obtaining a power correction coefficient according to the DCR value and a lookup DCR obtained by table lookup; and correcting the initial allowable power of the battery through the power correction coefficient to obtain the corrected allowable power of the battery.

10. An apparatus for detecting a direct current resistance (DCR) of a battery, comprising:

a pulse circuit, configured to apply multiple discharging current pulses during a constant current charging period of the battery in response to a DCR detection instruction; and a DCR detection circuit, configured to:

obtain a first battery voltage during a discharging current pulse time period;

obtain a second battery voltage during the constant current charging time period after the discharging current pulse within a current DCR detection period; and obtain a DCR value within the current DCR detection period according to the first battery voltage, the second battery voltage, and a battery capacity.

11. A computing device, comprising a memory, a processor, and a computer program stored in a non-transitory manner in the memory and executable on the processor, wherein the processor, when executing the computer program, implements the DCR detection method of claim 1.

12. A non-transitory computer-readable storage medium storing a computer program, wherein the computer program, when executed by a processor, implements the DCR detection method of claim 1.

13. An apparatus for detecting a direct current resistance (DCR) of a battery, comprising:

a pulse circuit, configured to apply multiple discharging current pulses during a constant current charging period of the battery in response to a DCR detection instruction; and a DCR detection circuit, configured to:

obtain a first battery voltage during a discharging current pulse time period;

obtain a second battery voltage during the constant current charging time period after the discharging current pulse within a current DCR detection period; and obtain a DCR value within the current DCR detection period according to the first battery voltage, the second battery voltage, and a battery capacity; wherein:

to obtain the DCR value within the current DCR detection period according to the first battery voltage, the second battery voltage, and a battery capacity comprises:

obtaining a voltage difference according to the first battery voltage and the second battery voltage; and obtaining a DCR value within the current DCR detection period according to a ratio of the voltage difference to the battery capacity.

* * * * *